United States Patent
Farooq et al.

(10) Patent No.: US 9,406,561 B2
(45) Date of Patent: Aug. 2, 2016

(54) THREE DIMENSIONAL INTEGRATED CIRCUIT INTEGRATION USING DIELECTRIC BONDING FIRST AND THROUGH VIA FORMATION LAST

(75) Inventors: Mukta G. Farooq, Hopewell Junction, NY (US); Robert Hannon, Wappingers Falls, NY (US); Subramanian S. Iyer, Mount Kisco, NY (US); Emily R. Kinser, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 555 days.

(21) Appl. No.: 12/426,466

(22) Filed: Apr. 20, 2009

(65) Prior Publication Data
US 2010/0264551 A1 Oct. 21, 2010

(51) Int. Cl.
*H01L 21/768* (2006.01)
*H01L 25/065* (2006.01)
(Continued)

(52) U.S. Cl.
CPC .......... *H01L 21/76898* (2013.01); *H01L 24/92* (2013.01); *H01L 25/0657* (2013.01); *H01L 25/50* (2013.01); *H01L 24/06* (2013.01); *H01L 24/80* (2013.01); *H01L 2224/0401* (2013.01); *H01L 2224/06181* (2013.01); *H01L 2224/08146* (2013.01); *H01L 2224/16145* (2013.01);
(Continued)

(58) Field of Classification Search
CPC .......................... H01L 27/76898; H01L 25/50
USPC .................................. 438/109, 620; 257/698
See application file for complete search history.

(56) References Cited

U.S. PATENT DOCUMENTS 4,285,969 A    8/1981  Galli et al.
4,939,101 A *  7/1990  Black et al. ................... 438/455
(Continued)

FOREIGN PATENT DOCUMENTS

| JP | 2008153499 A | 7/2008 |
| WO | 2005122706 A2 | 12/2005 |
| WO | 2006138470 A1 | 12/2006 |
| WO | 2011033601 A1 | 3/2011 |

OTHER PUBLICATIONS

L. W. Schaper et al.; "Architecural Implications and Process Development of 3-D VLSI Z-Axis Interconnects Using Through Silicon Vias," IEEE Transactions on Advanced Packaging, vol. 28, No. 3, Aug. 2005, pp. 356-366.

(Continued)

*Primary Examiner* — Laura Menz
*Assistant Examiner* — Candice Y Chan
(74) *Attorney, Agent, or Firm* — Cantor Colburn LLP; Steven Meyers

(57) ABSTRACT

A method of implementing three-dimensional (3D) integration of multiple integrated circuit (IC) devices includes forming a first insulating layer over a first IC device; forming a second insulating layer over a second IC device; forming a 3D, bonded IC device by aligning and bonding the first insulating layer to the second insulating layer so as to define a bonding interface therebetween, defining a first set of vias within the 3D bonded IC device, the first set of vias landing on conductive pads located within the first IC device, and defining a second set of vias within the 3D bonded IC device, the second set of vias landing on conductive pads located within the second device, such that the second set of vias passes through the bonding interface; and filling the first and second sets of vias with a conductive material.

27 Claims, 16 Drawing Sheets

(51) Int. Cl.
*H01L 25/00* (2006.01)
*H01L 23/00* (2006.01)

(52) U.S. Cl.
CPC .......... *H01L2224/32145* (2013.01); *H01L 2224/80896* (2013.01); *H01L 2224/8385* (2013.01); *H01L 2224/9202* (2013.01); *H01L 2224/94* (2013.01); *H01L 2225/06541* (2013.01)

(56) References Cited

U.S. PATENT DOCUMENTS

| | | | |
|---|---|---|---|
| 5,489,554 | A | 2/1996 | Gates |
| 5,753,536 | A * | 5/1998 | Sugiyama et al. ........ 438/108 |
| 5,889,302 | A * | 3/1999 | Liu .................. 257/315 |
| 6,566,232 | B1 | 5/2003 | Hara et al. |
| 6,577,013 | B1 | 6/2003 | Glenn et al. |
| 6,809,421 | B1 | 10/2004 | Hayasaka et al. |
| 6,821,826 | B1 | 11/2004 | Chan et al. |
| 7,157,787 | B2 | 1/2007 | Kim et al. |
| 7,312,487 | B2 | 12/2007 | Alam et al. |
| 7,354,798 | B2 | 4/2008 | Pogge et al. |
| 7,354,862 | B2 | 4/2008 | Wong et al. |
| 7,390,723 | B2 | 6/2008 | Chen |
| 7,410,884 | B2 | 8/2008 | Ramanathan et al. |
| 7,413,979 | B2 | 8/2008 | Rigg et al. |
| 7,427,803 | B2 | 9/2008 | Chao et al. |
| 7,435,913 | B2 | 10/2008 | Chong et al. |
| 7,494,846 | B2 | 2/2009 | Hsu et al. |
| 7,507,637 | B2 | 3/2009 | Suh et al. |
| 7,514,116 | B2 | 4/2009 | Natekar et al. |
| 7,531,453 | B2 | 5/2009 | Kirby et al. |
| 7,564,115 | B2 | 7/2009 | Chen et al. |
| 7,589,008 | B2 | 9/2009 | Kirby |
| 7,598,523 | B2 | 10/2009 | Luo et al. |
| 7,598,617 | B2 | 10/2009 | Lee et al. |
| 7,629,249 | B2 | 12/2009 | Borthakur |
| 7,666,711 | B2 | 2/2010 | Pagaila et al. |
| 7,666,768 | B2 | 2/2010 | Raravikar et al. |
| 7,670,950 | B2 | 3/2010 | Richardson et al. |
| 7,683,458 | B2 | 3/2010 | Akram et al. |
| 7,691,748 | B2 | 4/2010 | Han |
| 7,692,310 | B2 | 4/2010 | Park et al. |
| 7,692,448 | B2 | 4/2010 | Solomon |
| 7,692,946 | B2 | 4/2010 | Taufique et al. |
| 7,741,148 | B1 | 6/2010 | Marimuthu et al. |
| 7,741,156 | B2 | 6/2010 | Pagaila et al. |
| 7,749,899 | B2 | 7/2010 | Clark et al. |
| 7,750,459 | B2 | 7/2010 | Dang et al. |
| 7,759,165 | B1 | 7/2010 | Bajaj |
| 7,759,800 | B2 | 7/2010 | Rigg et al. |
| 7,772,880 | B2 | 8/2010 | Solomon |
| 7,776,741 | B2 | 8/2010 | Reid et al. |
| 7,777,330 | B2 | 8/2010 | Pelley et al. |
| 7,786,008 | B2 | 8/2010 | Do et al. |
| 7,791,175 | B2 | 9/2010 | Pyeon |
| 7,795,134 | B2 | 9/2010 | Sulfridge |
| 7,795,139 | B2 | 9/2010 | Han et al. |
| 7,795,650 | B2 | 9/2010 | Eminoglu et al. |
| 7,795,735 | B2 | 9/2010 | Hsu et al. |
| 7,799,613 | B2 | 9/2010 | Dang et al. |
| 7,803,714 | B2 | 9/2010 | Ramiah et al. |
| 7,812,446 | B2 | 10/2010 | Kurita |
| 7,812,459 | B2 | 10/2010 | Yu et al. |
| 7,813,043 | B2 | 10/2010 | Lusinchi et al. |
| 7,816,227 | B2 | 10/2010 | Chen et al. |
| 7,821,107 | B2 | 10/2010 | Pratt |
| 7,825,024 | B2 | 11/2010 | Lin et al. |
| 7,829,976 | B2 | 11/2010 | Kirby et al. |
| 7,830,018 | B2 | 11/2010 | Lee |
| 7,830,692 | B2 | 11/2010 | Chung et al. |
| 7,834,440 | B2 | 11/2010 | Ito et al. |
| 7,838,337 | B2 | 11/2010 | Marimuthu et al. |
| 7,838,967 | B2 | 11/2010 | Chen |
| 7,838,975 | B2 | 11/2010 | Chen |
| 7,843,064 | B2 | 11/2010 | Kuo et al. |
| 7,847,379 | B2 | 12/2010 | Chung |
| 7,848,153 | B2 | 12/2010 | Bruennert et al. |
| 7,859,099 | B2 | 12/2010 | Choi et al. |
| 7,863,106 | B2 | 1/2011 | Christo et al. |
| 7,863,187 | B2 | 1/2011 | Hiatt et al. |
| 7,863,721 | B2 | 1/2011 | Suthiwongsunthorn et al. |
| 7,867,821 | B1 | 1/2011 | Chin |
| 7,872,332 | B2 | 1/2011 | Fay et al. |
| 7,875,948 | B2 | 1/2011 | Hynecek et al. |
| 7,883,938 | B2 | 2/2011 | Kolan et al. |
| 7,884,015 | B2 | 2/2011 | Sulfridge |
| 7,884,016 | B2 | 2/2011 | Sprey et al. |
| 7,884,466 | B2 | 2/2011 | Ishihara et al. |
| 7,888,668 | B2 | 2/2011 | Kuo et al. |
| 7,893,526 | B2 | 2/2011 | Mun et al. |
| 7,893,529 | B2 | 2/2011 | Hsu et al. |
| 7,898,095 | B2 | 3/2011 | Patti et al. |
| 7,900,519 | B2 | 3/2011 | Chandrasekaran |
| 7,902,069 | B2 | 3/2011 | Andry et al. |
| 7,902,643 | B2 | 3/2011 | Tuttle |
| 7,904,273 | B2 | 3/2011 | Liu et al. |
| 7,906,431 | B2 | 3/2011 | Mistuhashi |
| 7,910,473 | B2 | 3/2011 | Chen |
| 7,913,000 | B2 | 3/2011 | Chung |
| 7,915,736 | B2 | 3/2011 | Kirby et al. |
| 7,923,370 | B2 | 4/2011 | Pyeon |
| 7,933,428 | B2 | 4/2011 | Sawada |
| 7,936,052 | B2 | 5/2011 | Barth et al. |
| 7,939,369 | B2 | 5/2011 | Farooq et al. |
| 7,939,941 | B2 | 5/2011 | Chiou et al. |
| 7,943,473 | B2 | 5/2011 | Ellul et al. |
| 7,943,513 | B2 | 5/2011 | Lin |
| 7,952,171 | B2 | 5/2011 | Pratt |
| 7,958,627 | B2 | 6/2011 | Randall et al. |
| 7,960,242 | B2 | 6/2011 | Or-Bach et al. |
| 7,960,282 | B2 | 6/2011 | Yelehanka et al. |
| 7,964,916 | B2 | 6/2011 | Or-Bach et al. |
| 7,973,413 | B2 | 7/2011 | Kuo et al. |
| 7,977,158 | B2 | 7/2011 | Kurita |
| 7,986,042 | B2 | 7/2011 | Or-Bach et al. |
| 7,989,318 | B2 | 8/2011 | Yang et al. |
| 8,008,192 | B2 | 8/2011 | Sulfridge |
| 8,014,166 | B2 | 9/2011 | Yazdani |
| 2006/0057836 | A1 | 3/2006 | Nagarajan et al. |
| 2006/0278979 | A1 | 12/2006 | Rangel |
| 2006/0286767 | A1 | 12/2006 | Clarke et al. |
| 2007/0117348 | A1 | 5/2007 | Ramanathan et al. |
| 2007/0166997 | A1 | 7/2007 | Knorr et al. |
| 2007/0231950 | A1 | 10/2007 | Pozder et al. |
| 2008/0029896 | A1 | 2/2008 | Lee |
| 2008/0061419 | A1 | 3/2008 | Enquist et al. |
| 2009/0004777 | A1 | 1/2009 | Kolan et al. |
| 2010/0264551 | A1 | 10/2010 | Farooq et al. |

OTHER PUBLICATIONS

R. Hon et al.; "Multi-Stack Flip Chip 3D Packaging with Copper Plated Through-Silicon Vertical Interconnection," IEEE Electronics Packaging Technology Conference, 2005, pp. 384-389.
M. Kawano et al.; "A 3D Packing Technology for 4 Gbit Stacked DRAM with 3 Gbps Data Transfer," 2006 International Electron Devices Meeting.
Lee Wen Sheng Vincent et al.; "Cu via Exposure by Backgrinding for TSV Applications," 2007 9th Electronics Packaging Technology Conference; pp. 233-237.
S. Pozder et al.; "Progress of 3D Integration Technologies and 3D Interconnects;" IEEE 2007; pp. 213-215.
S. Denda; "Process Examination of Through Silicon Via Technology;" 2007 IEEE 149 IEEE Polytronic 2007 Conference; pp. 149-152.
International Search Report and Written Opinion, Jun. 3, 2010.
International Search Report and the Written Opinion of the International Searching Authority dated Jun. 3, 2010, Form PCT/ISA/220, PCT/US2010/030357.
European Patent Office, Search Report, Application No. 10767507.6 Dec. 20, 2013, 8 pages.
Chinese Office Action; Application No. 201080010340.2; Date of Mailing: May 22, 2013; pp. 1-8.

* cited by examiner

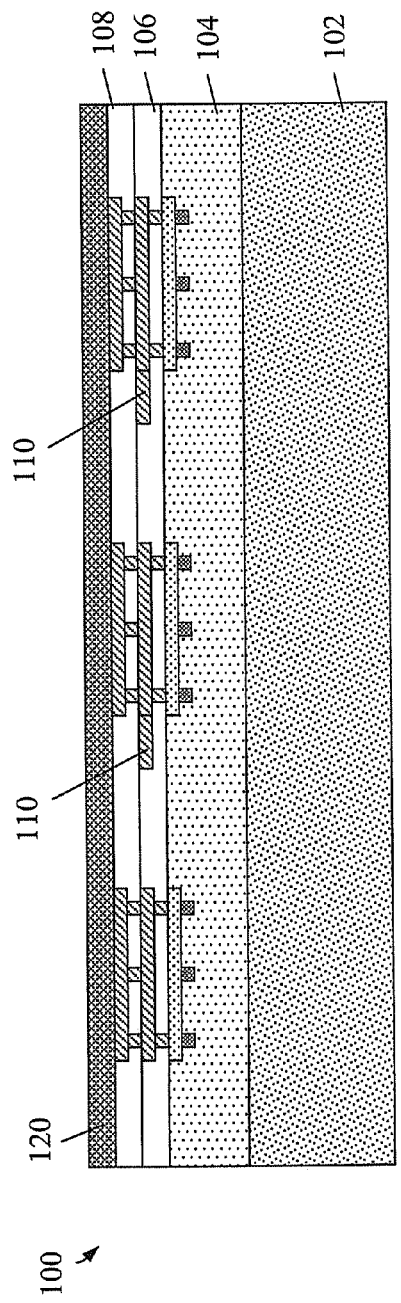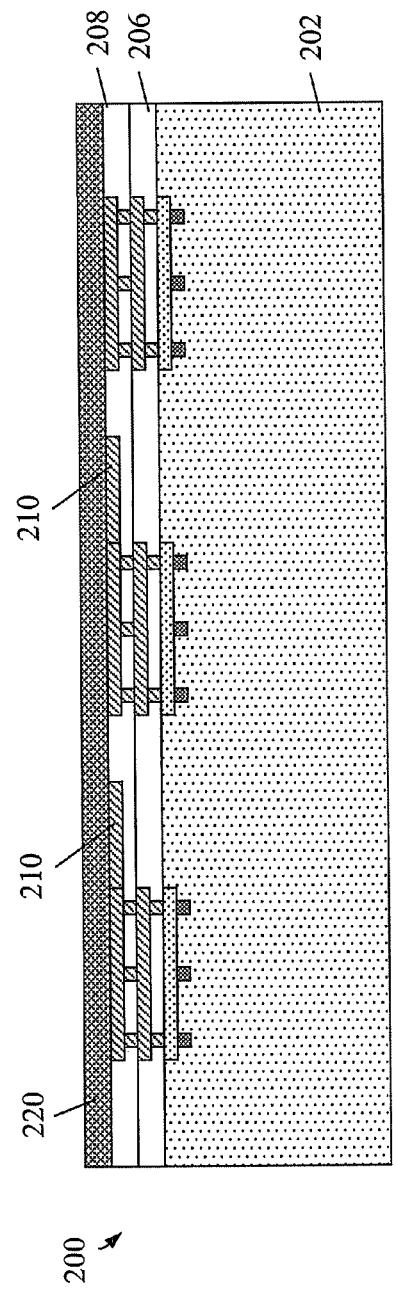
Fig. 2(a)
Fig. 2(b)

US 9,406,561 B2

THREE DIMENSIONAL INTEGRATED CIRCUIT INTEGRATION USING DIELECTRIC BONDING FIRST AND THROUGH VIA FORMATION LAST

BACKGROUND

The present invention relates generally to semiconductor device manufacturing techniques and, more particularly, to implementing three-dimensional integration of multiple integrated circuit (IC) devices.

The packaging density in electronic industry continuously increases in order to accommodate more electronic devices into a package. In this regard, three-dimensional (3D) wafer-to-wafer stacking technology substantially contributes to the device integration process. Typically, a semiconductor wafer includes several layers of integrated circuitry (e.g., processors, programmable devices, memory devices, etc.) built on a silicon substrate. A top layer of the wafer may be connected to a bottom layer of the wafer through silicon interconnects or vias. In order to form a 3D wafer stack, two or more wafers are placed on top of one other and bonded.

3D wafer stacking technology offers a number of potential benefits, including, for example, improved form factors, lower costs, enhanced performance, and greater integration through system-on-chip (SOC) solutions. In addition, the 3D wafer stacking technology may provide other functionality to the chip. For instance, after being formed, the 3D wafer stack may be diced into stacked dies or chips, with each stacked chip having multiple tiers (i.e., layers) of integrated circuitry. SOC architectures formed by 3D wafer stacking can enable high bandwidth connectivity of products such as, for example, logic circuitry and dynamic random access memory (DRAM), that otherwise have incompatible process flows. At present, there are many applications for 3D wafer stacking technology, including high performance processing devices, video and graphics processors, high density and high bandwidth memory chips, and other SOC solutions.

SUMMARY

In an exemplary embodiment, a method of implementing three-dimensional (3D) integration of multiple integrated circuit (IC) devices includes forming a first insulating layer over a first IC device; forming a second insulating layer over a second IC device; forming a 3D, bonded IC device by aligning and bonding the first insulating layer of the first IC device to the second insulating layer of the second IC device so as to define a bonding interface therebetween, wherein the bonding interface is absent of electrically conductive materials; subsequent to the bonding, defining a first set of vias within the 3D bonded IC device, the first set of vias landing on conductive pads located within the first IC device, and defining a second set of vias within the 3D bonded IC device, the second set of vias landing on conductive pads located within the second device, such that the second set of vias passes through the bonding interface; and filling the first and second sets of vias with a conductive material, and electrically connecting at least one via of the first set of vias to at least one via of the second set of vias, thereby establishing electrical communication between the first and second ICs of the 3D bonded IC device.

In another embodiment, a method of implementing three-dimensional (3D) integration of multiple integrated circuit (IC) devices includes forming a first IC device having a semiconductor substrate, front-end-of-line (FEOL) structures, middle-of-line (MOL) structures, and back-end-of-line (BEOL) structures, with a first insulating layer over the BEOL structures of the first IC device; forming a second IC device having a semiconductor substrate, FEOL structures, MOL structures, and BEOL structures, with a second insulating layer over the BEOL structures of the second IC device; forming a 3D, bonded IC device by aligning and bonding the first insulating layer of the first IC device to the second insulating layer of the second IC device so as to define a first bonding interface therebetween, wherein the first bonding interface is absent of electrically conductive materials; subsequent to the bonding, defining a first set of vias within the 3D bonded IC device, the first set of vias landing on conductive pads located within the first IC device, and defining a second set of vias within the 3D bonded IC device, the second set of vias landing on conductive pads located within the second device, such that the second set of vias passes through the first bonding interface; and filling the first and second sets of vias with a conductive material, and electrically connecting at least one via of the first set of vias to at least one via of the second set of vias, thereby establishing electrical communication between the first and second ICs of the 3D bonded IC device.

In another embodiment, a three-dimensional (3D) integrated circuit (IC) device includes a first IC device bonded to a second IC device at a first bonding interface therebetween, thereby defining a 3D, bonded IC device, the first bonding interface defined between a first insulating layer of the first IC device and second insulating layer of the second IC device, wherein the first bonding interface is absent of electrically conductive materials; a first set of vias defined within the 3D bonded IC device, the first set of vias landing on conductive pads located within the first IC device, and a second set of vias defined within the 3D bonded IC device, the second set of vias landing on conductive pads located within the second device, such that the second set of vias passes through the first bonding interface; and the first and second sets of vias filled with a conductive material, and electrically connecting at least one via of the first set of vias to at least one via of the second set of vias, thereby establishing electrical communication between the first and second ICs of the 3D bonded IC device.

BRIEF DESCRIPTION OF THE SEVERAL VIEWS OF THE DRAWINGS

Referring to the exemplary drawings wherein like elements are numbered alike in the several Figures:

FIGS. 1 through 16 are a series of cross-sectional views illustrating a method of implementing three-dimensional integration of multiple integrated circuit (IC) devices, in accordance with an embodiment of the invention.

DETAILED DESCRIPTION

One disadvantage associated with the current 3D wafer stacking technology concerns the use of adhesives to bond the wafers. Such adhesives limit the amount of practical, in-fab processing and raised reliability concerns due to undesirable inherent polymeric adhesive properties, such as thermal stability. In addition, achieving acceptable alignment of pre-existing through silicon vias (TSV) across the entire diameter of a pair of wafers is also difficult, which also creates reliability concerns.

Accordingly, disclosed herein is a method and resulting structure for 3D wafer integration bonding in which the TSVs are formed post bonding. In this manner, the actual bonding involves only oxide-to-oxide bonding (or more generally insulator-to-insulator bonding) of the wafers, in that because the TSVs are not formed on the individual wafers prior to bonding, there are no alignment issues therebetween with respect to the vias.

It should be appreciated that although specific wafer substrate bonding process flows are depicted herein, such descriptions are exemplary only, and that the principles disclosed herein are also applicable to various types of TSV conductive materials, dielectric and adhesive interface materials, and multiple types of semiconductor wafers and substrates.

Figure 1A:
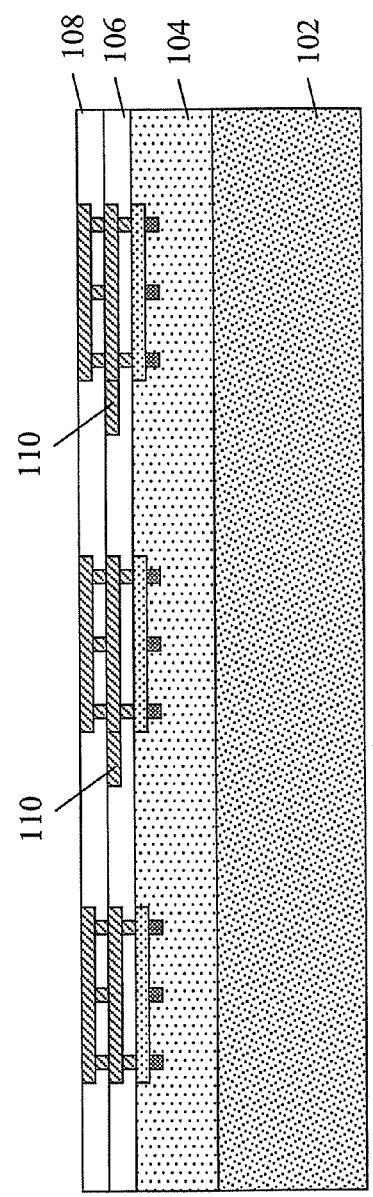

Referring initially to FIG. 1(a), there is shown a cross-sectional view of a first wafer 100 to be integrated and bonded with one or more additional wafers. In the exemplary embodiment depicted, the wafer 100 represents a memory wafer having front-end-of-line (FEOL), middle-of-line (MOL), and back-end-of-line (BEOL) structures formed thereon, as known in the art. In addition, the exemplary memory wafer 100 is shown having a thick sacrificial base layer 102 (e.g., a heavily doped P+ layer), and a lightly doped epitaxial layer 104 formed on the sacrificial base layer. The sacrificial base layer 102 may have a dopant concentration of, for example, 1000 times that of the epi-layer 104. The FEOL structures are formed in the epi-layer 104, which serves as the memory layer substrate. As indicated above, this layer 104 could be embodied by a bulk substrate of semiconducting material or a semiconductor-on-insulator (SOI) substrate.

As will be appreciated, the wiring layers (e.g., 106 and 108) shown in the MOL and BEOL regions of the wafer are illustrative only. In an actual device, there may be several layers of insulator materials and associated wiring formed therein. As also shown in FIG. 1(a), one or more strap/landing pads 110 are formed in the wiring layers. For purposes of illustration, the pads are shown at the M1 (first) level of wiring, although such pads can be formed at various levels within the device.

Figure 1B:
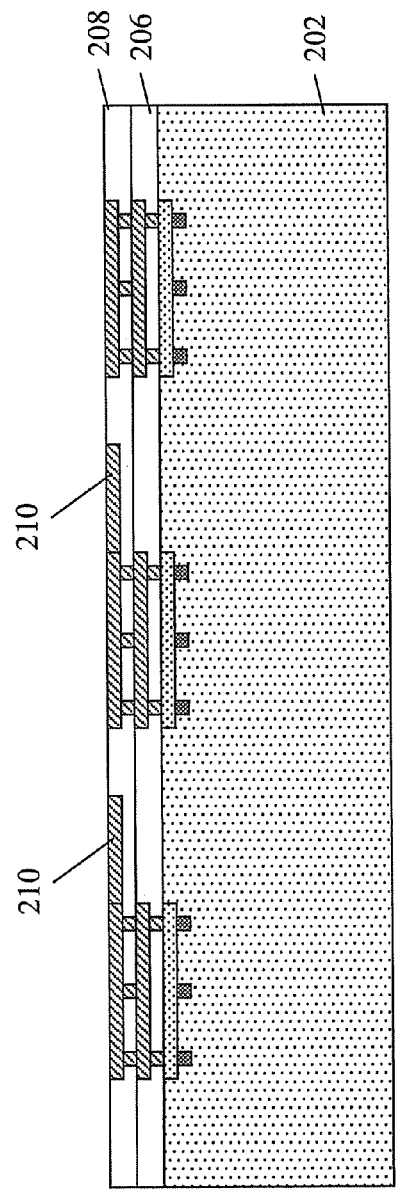

Referring now to FIG. 1(b), there is shown a cross-sectional view of a second wafer 200 to be integrated and bonded with the first wafer 100 shown in FIG. 1(a). In the exemplary embodiment depicted, the wafer 200 represents a processor wafer having FEOL, MOL and BEOL structures formed thereon, as known in the art. In addition, the exemplary memory wafer 200 is shown having a base substrate layer 202 (e.g., a P-type layer), which may be embodied by a bulk substrate of semiconducting material such as silicon or an SOI substrate. Again, the wiring layers (e.g., 206 and 208) shown in the MOL and BEOL regions of the wafer 200 are illustrative only. As is the case with the memory wafer 100, the processor wafer 200 also includes metal strap/landing pads 210 formed in one or more of the wiring layers.

Figure 3:
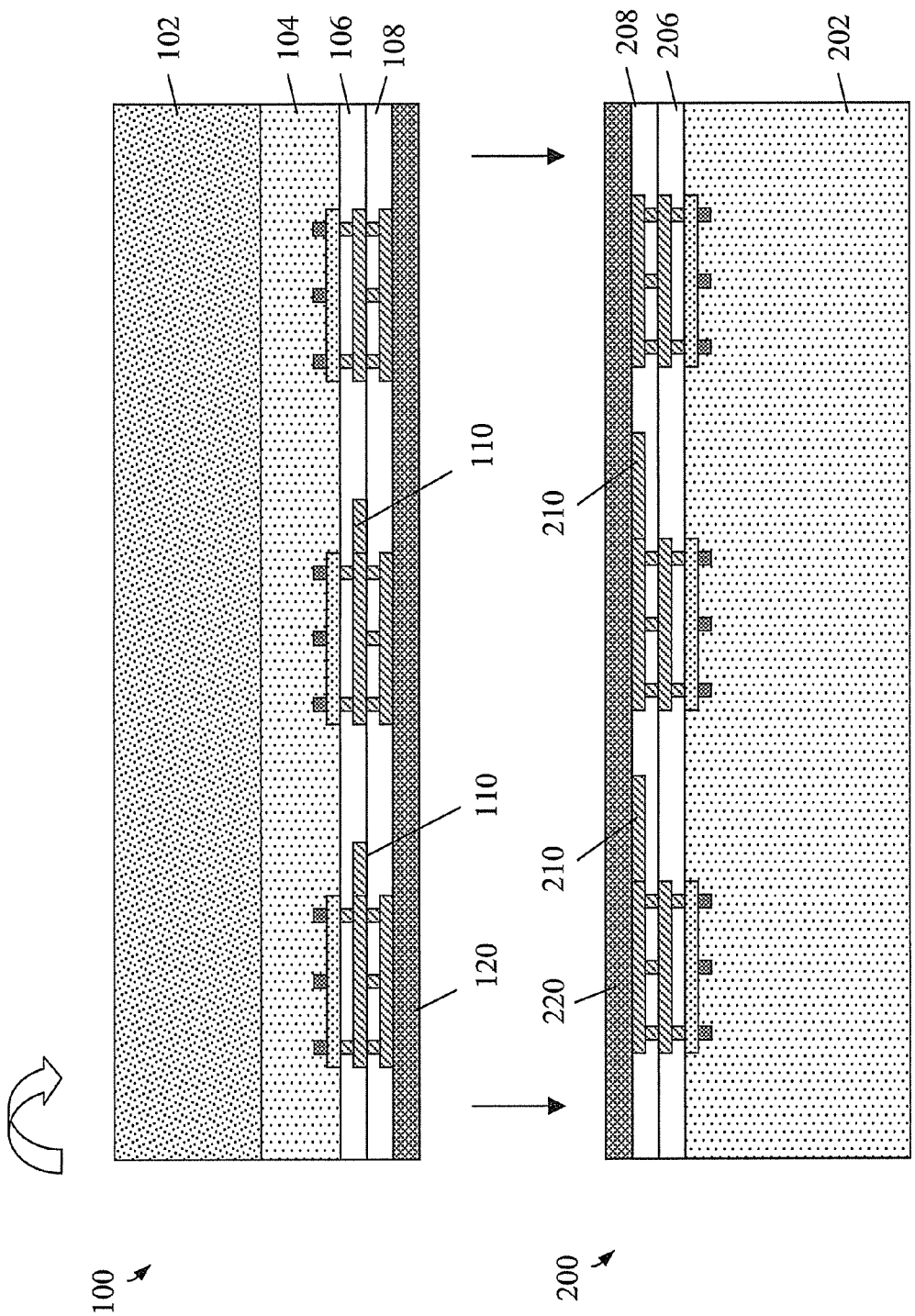

FIGS. 2(a) and 2(b) depict passivation of the wafers 100, 200, respectively, with an oxide layer 120, 220, or other suitable type of insulator material (including any adhesive material) in preparation of wafer bonding. Both passivated wafers 100, 200 are then shown together in FIG. 3 where, in particular, memory wafer 100 is flipped and aligned with processor wafer 200. Such alignment may be implemented through any known techniques such as, for example, infrared (IR) alignment or other suitable method. It will be noted that since no TSVs have been formed in either of the wafers 100, 200 to this point, there is no need to align any conductor materials between the wafers.

Figure 4:
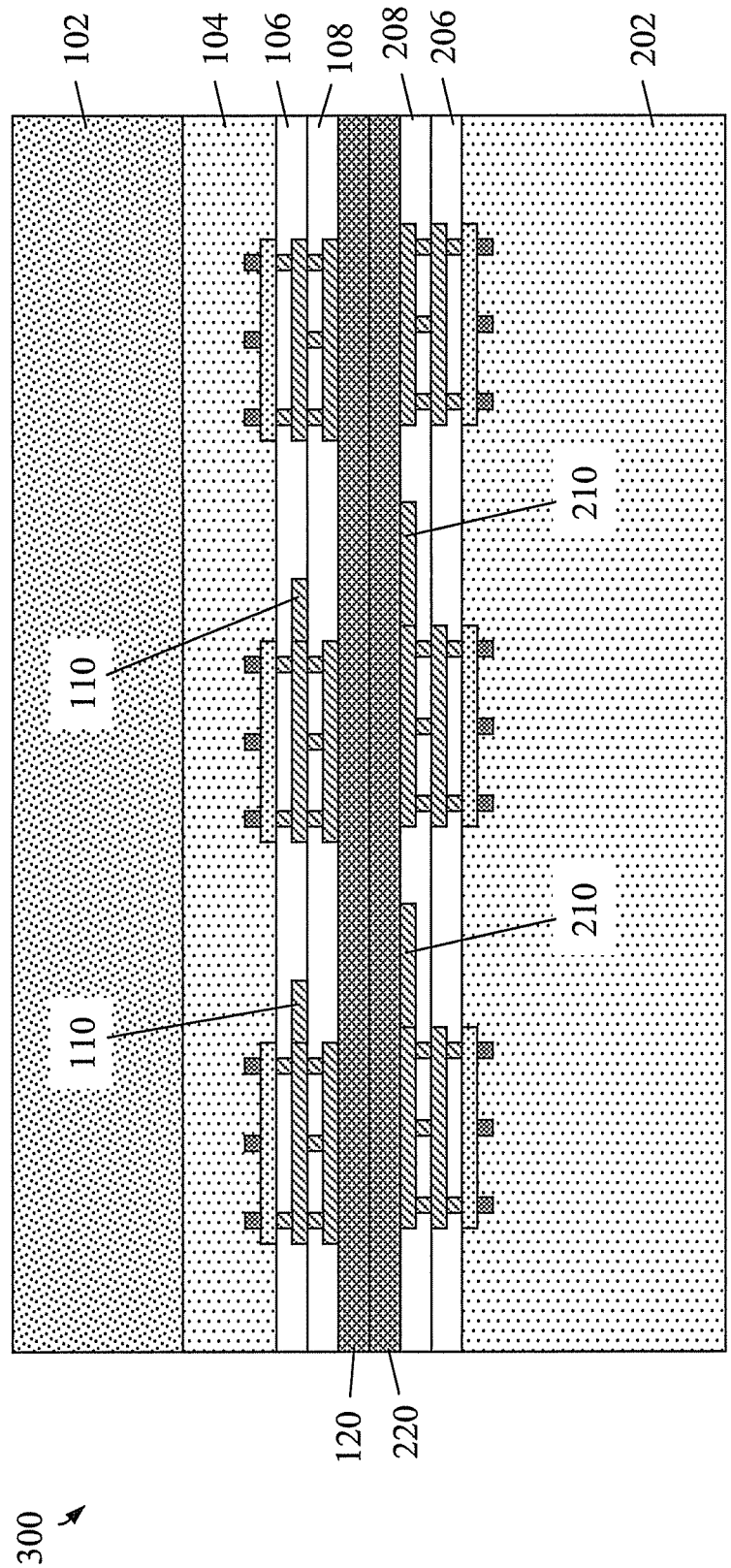

As then shown in FIG. 4, the wafers 100, 200 are bonded together to form an integrated wafer, now depicted generally at 300. Where oxide is used as the passivation material for the individual wafers, the bonding may be, for example, oxide-to-oxide bonding (e.g., by annealing), oxide/adhesive bonding, or any other suitable technique known in the art that results in a strong bond between electrically insulating layers.

Thus bonded, integrated wafer 300 has a bonding interface 302 between layers 120 and 220, wherein the interface is comprised entirely of insulating materials, and no conducting materials such as vias.

It should be appreciated at this point that the exemplary wafers 100, 200 that are bonded to form integrated wafer 300 need not be the specific types of wafers presented in the above example. For instance, a processor wafer could also be "flipped" and bonded to a memory wafer. In addition, one memory wafer could be flipped and bonded in the above described manner to another memory wafer. Even more generally, the wafers 100, 200 may represent any type of integrated circuit device formed on a substrate where it is desired to integrate the same or other types of integrated circuit devices in a 3D fashion.

Figure 5:
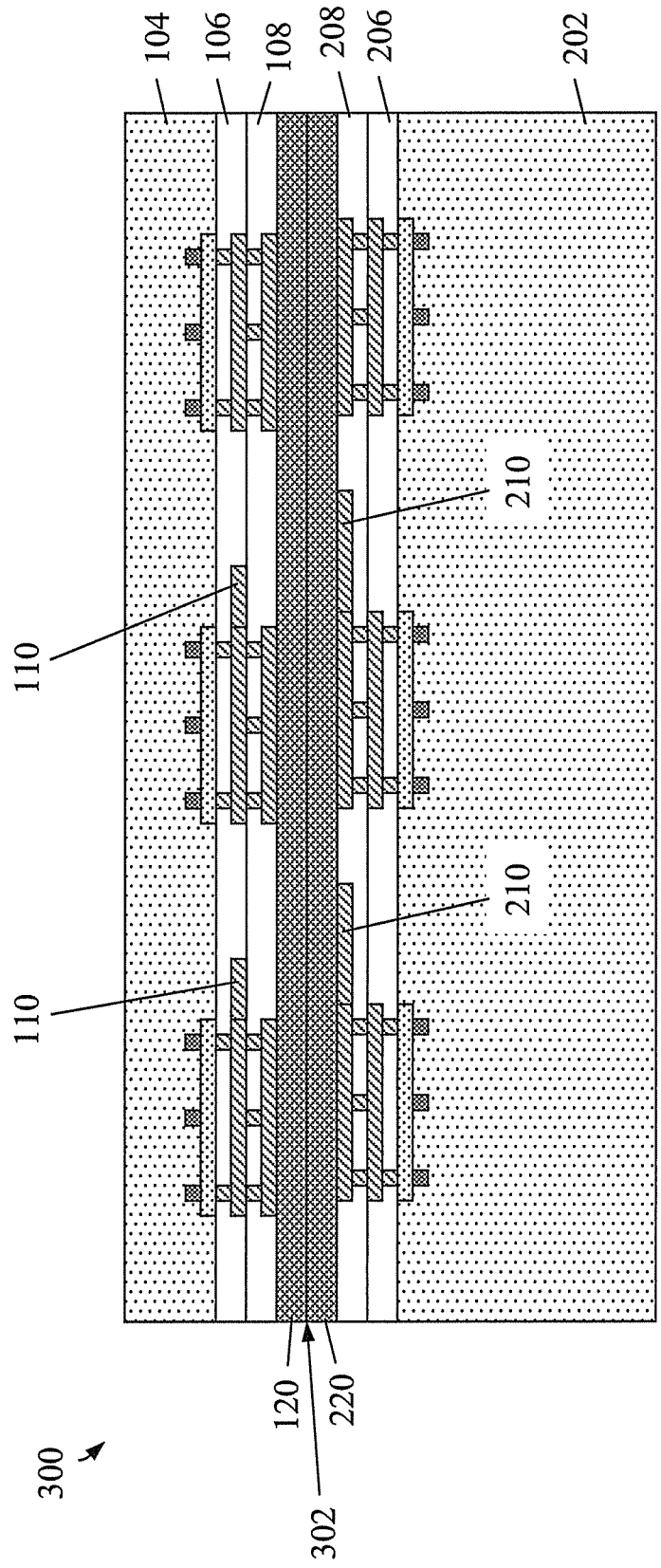

In any case, FIG. 5 illustrates the removal of the thick sacrificial base layer used in forming the memory portion of the wafer 300. The removal may be implemented by any suitable means in the semiconductor arts including, for example, techniques such as grinding, chemical mechanical polishing (CMP), etching, etc., as well as combinations thereof. By doping the sacrificial base layer at such a heavy concentration with respect to the epitaxial layer 104, a strong etch selectivity between the two layers results. Thus, etching becomes one suitable technique for removal of the sacrificial base layer. Upon removal of the sacrificial base layer, the epitaxial layer 104 of the memory portion of the integrated wafer 300 is now exposed for further processing.

Figure 6:
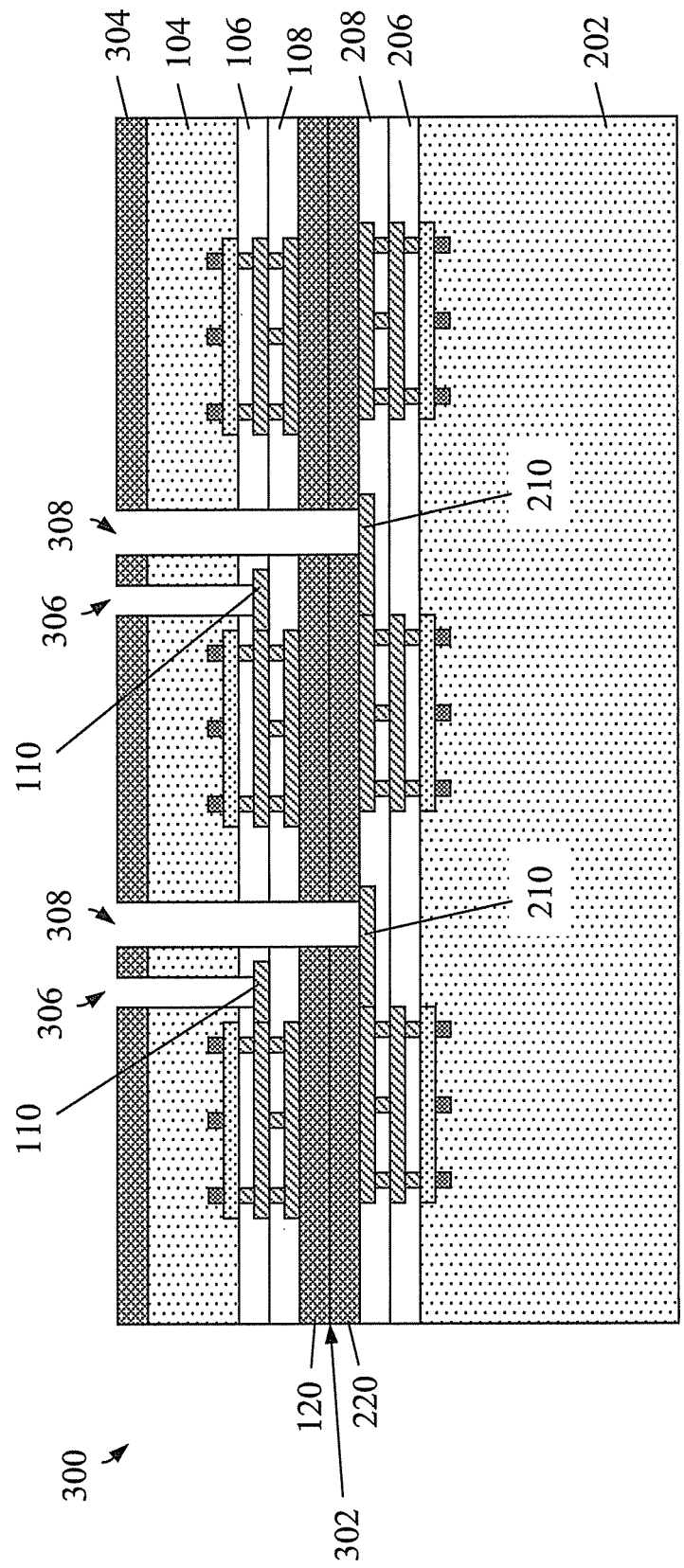

Referring now to FIG. 6, the processing steps for the "via last" TSV formation are commenced. This may include, for example, forming a passivation layer 304 (e.g., an oxide) on the epitaxial layer 104. Then, first and second sets of TSVs are defined by via patterning and etching. More specifically, a "shallow" set of TSVs 306 is formed through the passivation layer 304, the epitaxial layer 104, and one or more of the wiring layers 106, 108 corresponding to the particular locations of the landing pads 110 of the memory portion of the wafer 300. In addition, a "deep" set of TSVs 308 is formed through the entirety of the memory portion of the wafer 300, as well as the passivation layers 120 and 220, down to the landing pads 210 in the processor portion of the wafer 300. As is the case with the landing pads 110 in the memory portion, the landing pads 210 in the processor portion may also be located in various wiring levels, and thus the deep TSV etch may continue through one or more of the wiring layer 206, 208 in the event the landing pads 210 are present at these levels.

Figure 7:
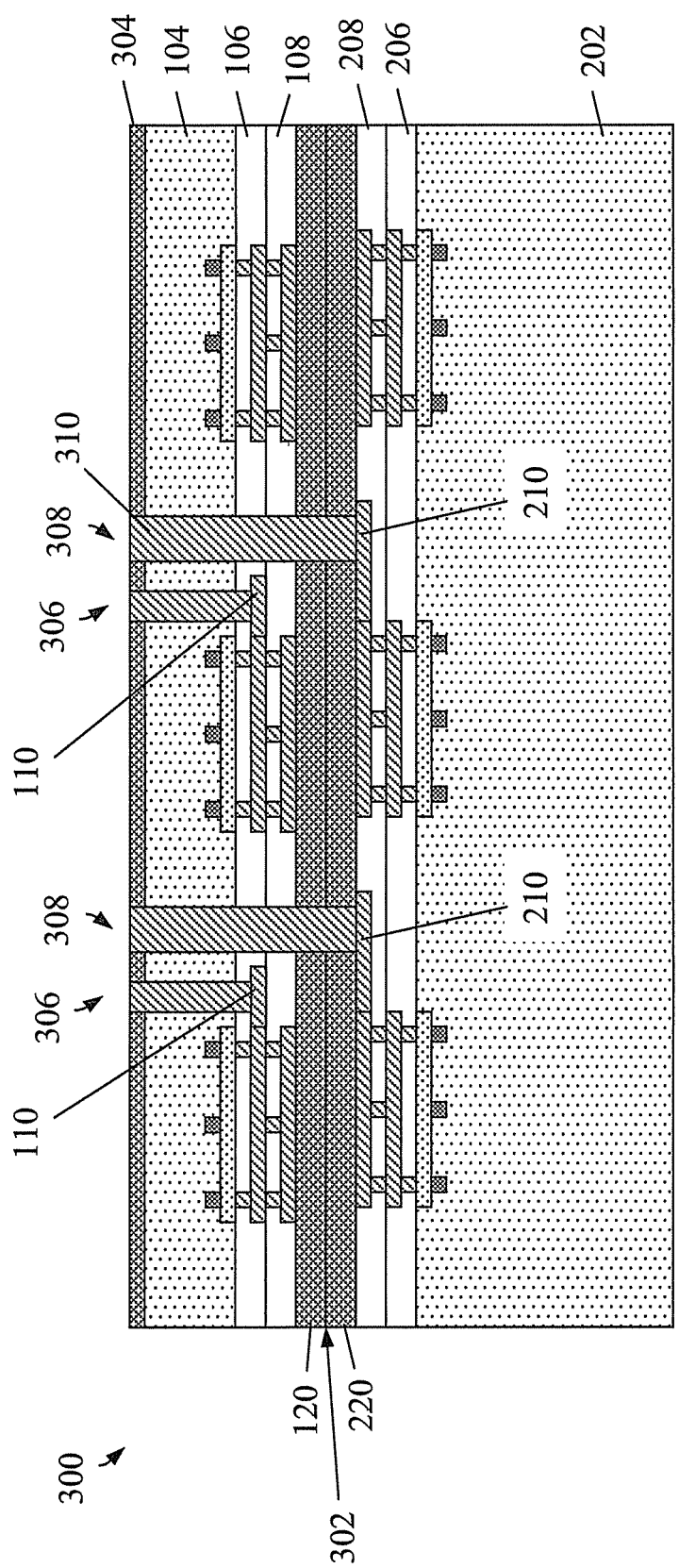

In an exemplary embodiment, the shallow TSVs 306 may have a diameter of about 2-3 microns (μm), a total depth of about 8-15 μm, and a pitch (spacing) of about 10 μm or more. The deep TSVs 308 may have a diameter of about 5-10 μm, a total depth of about 25-40 μm, and a pitch of about 10 μm or more. After the initial etch of both sets of the TSVs, an oxide liner is formed on sidewalls thereof in order to prevent subsequent diffusion of the conductive via fill materials. The deposition of a thin oxide liner is then followed up by an anisotropic etch to remove the liner from the horizontal surfaces, such as the metallic landing pads 110, 210. Then, standard processing may be carried out to form a via liner layer (e.g., tantalum, tantalum nitride, etc.), metal seed layer, and metal fill 310 (e.g., copper), after which the excess material is planarized such as by CMP, as shown in FIG. 7.

Figure 8:
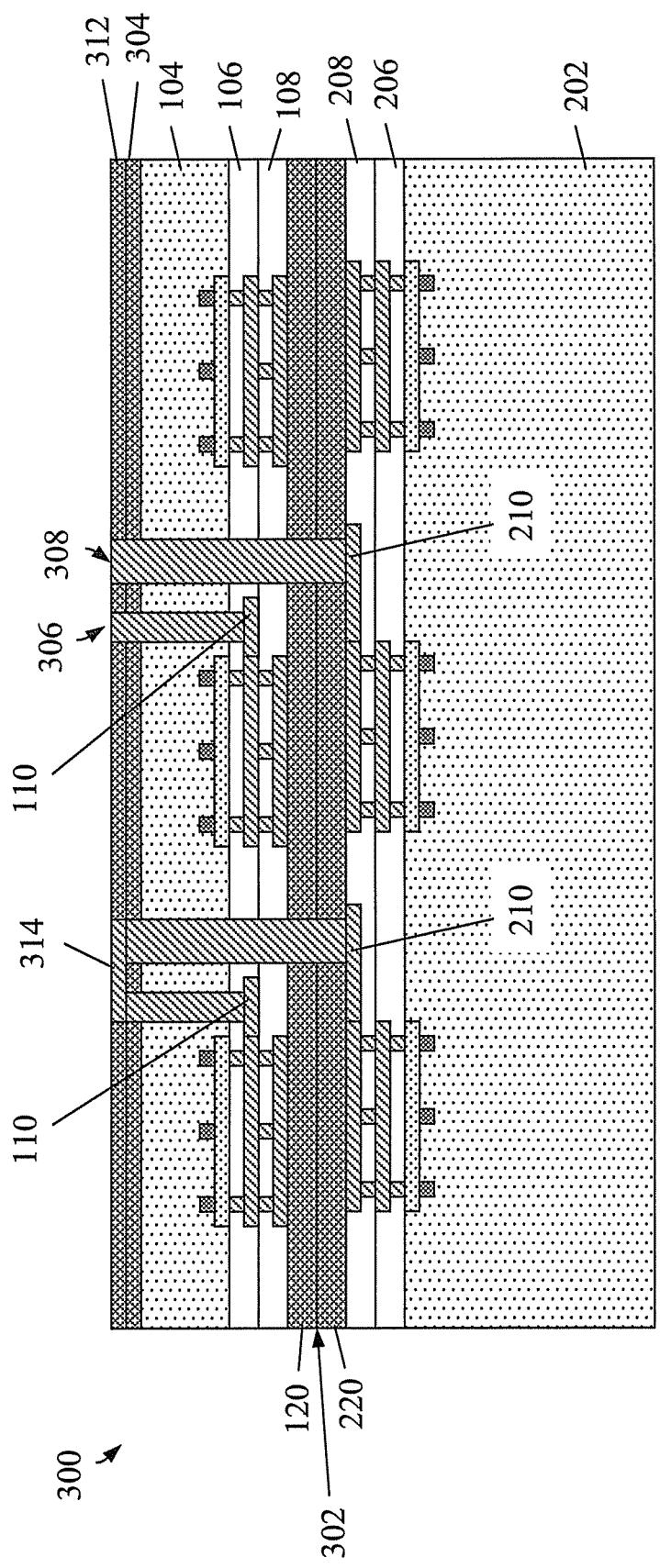

At this point in the process, any connection straps desired between shallow and deep TSVs (thereby defining electrical communication between the processor and memory portions of the integrated wafer 300) may be formed such as shown in FIG. 8. As is shown, another passivation (e.g., oxide) layer 312 is formed, followed by patterning etching, liner layer, seed layer, metal plating and CMP to form a connection strap 314 between a shallow/deep TSV pair. Although the embodiment depicted is an example of single damascene processing, it will be understood that dual damascene processing can also be used to simultaneously define and fill the via and strap structures.

Figure 9:
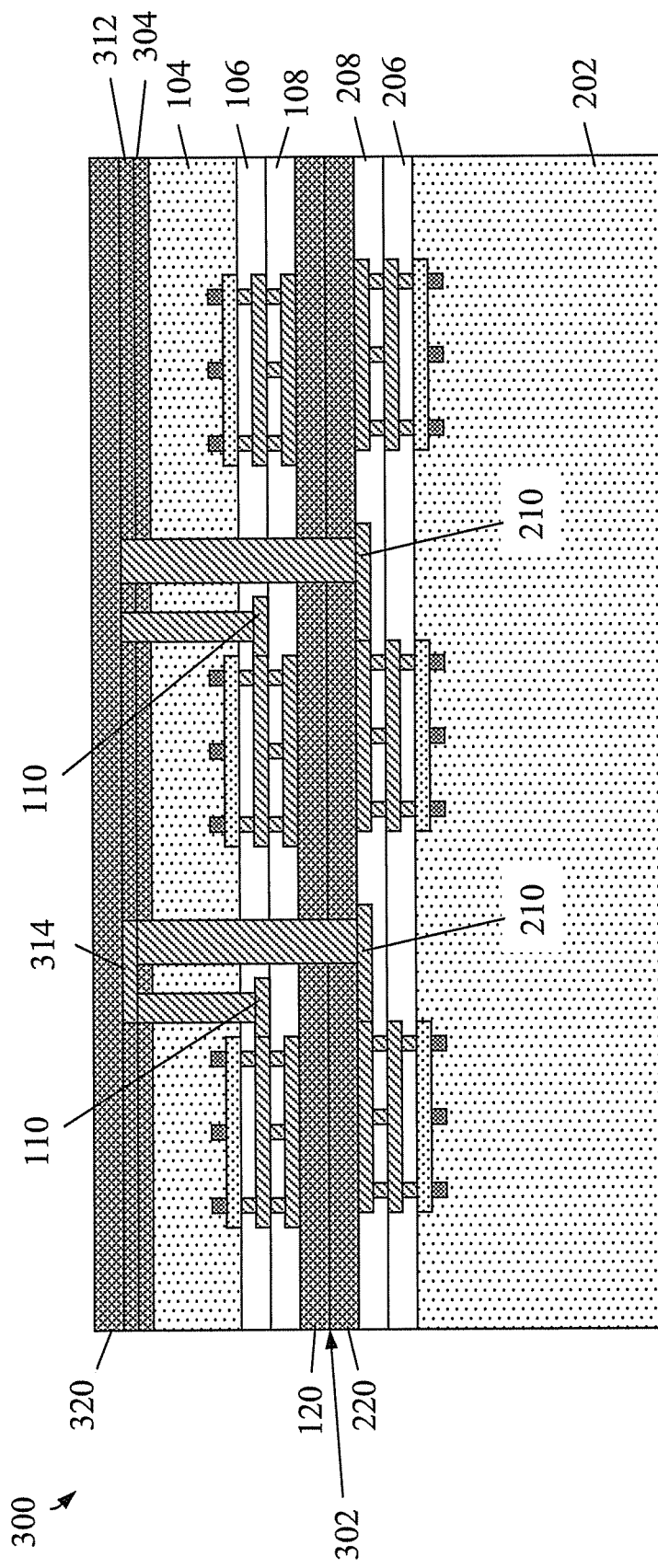

In the event the resulting 3D integrated structure were substantially complete at this point, final processing steps would then be implemented, such as forming a top passivation layer (not shown), patterning the passivation layer and forming a conductive capture pad (not shown) or other metallurgy for an external connection such as a C4 solder ball. However, for purposes of illustration, it will be assumed that further 3D wafer integration is desired, such as (for example) the addition of more memory chips. Accordingly, as shown in FIG. 9, another layer 320 of passivation is formed on the wafer. Layer 320 may be, for example, an oxide layer such as used for layers 120, 220, or other suitable type of insulator material including any adhesive material in preparation of wafer bonding.

Figure 10:
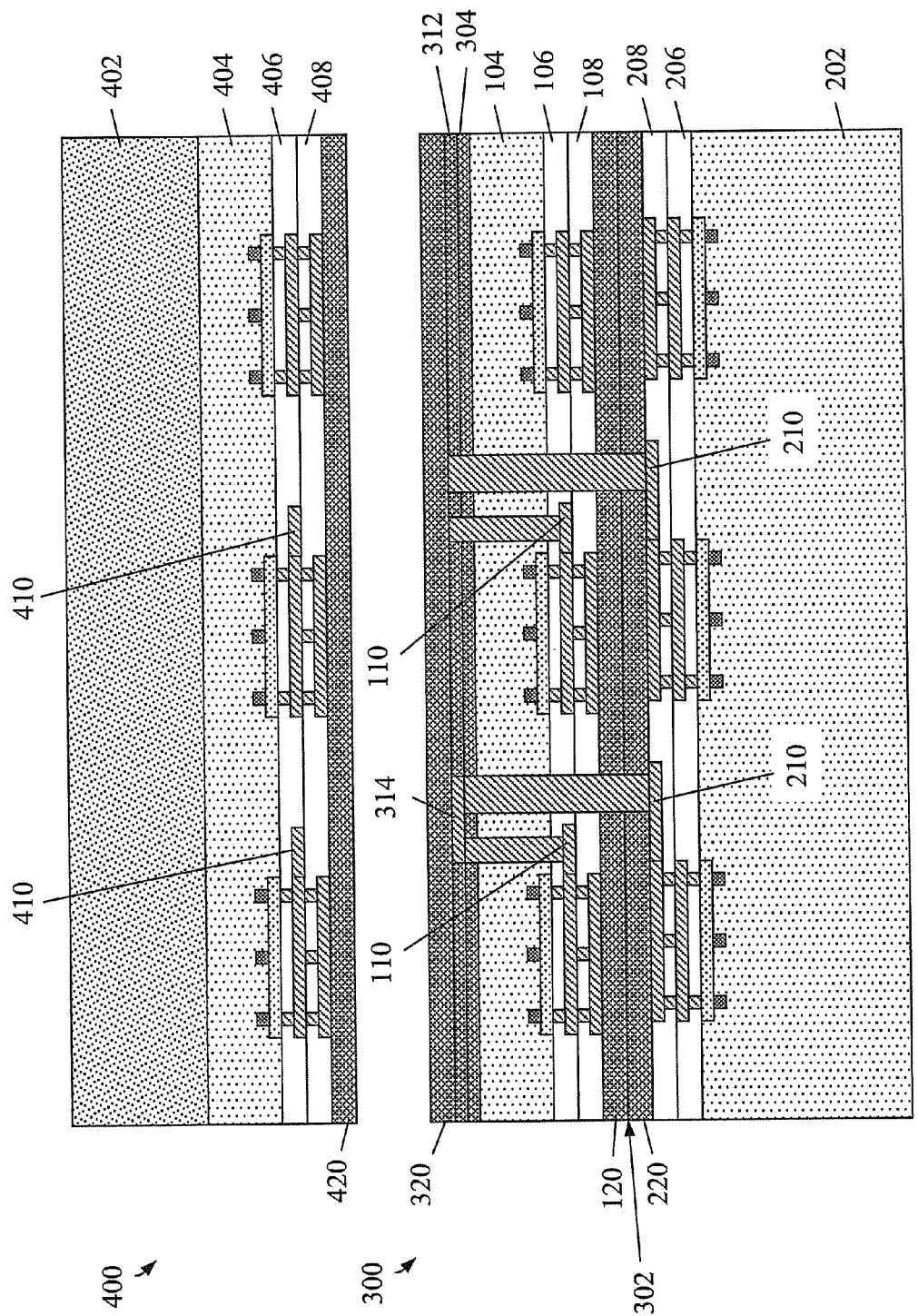
Figure 11:
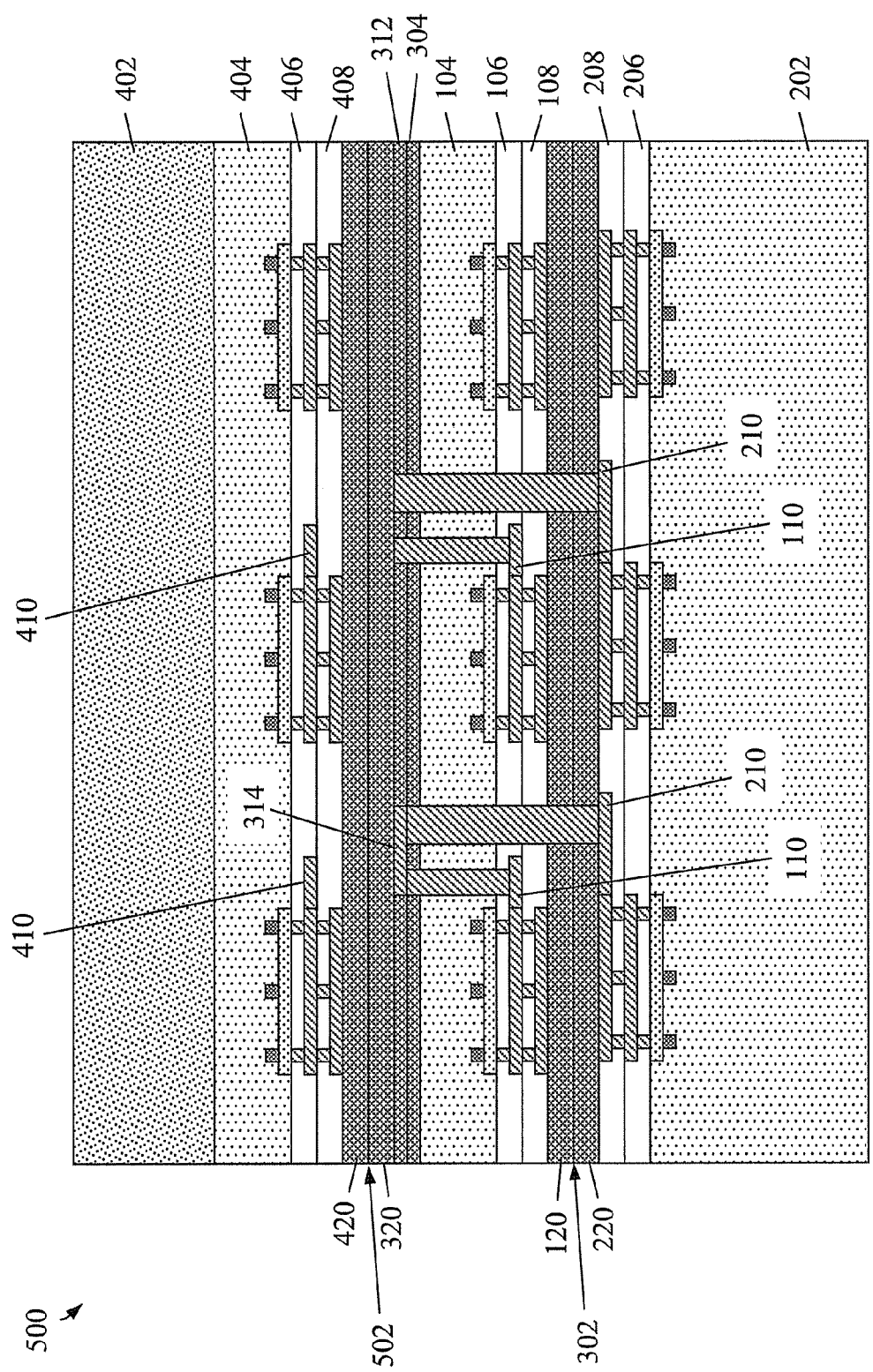

FIG. 10 illustrates the alignment of a second memory wafer 400 with the integrated wafer 300. The second memory wafer 400 is similar in construction with respect to the first memory wafer 100 shown in FIG. 3, in that the wafer 400 includes a thick sacrificial base layer 402 (e.g., a heavily doped P+ layer), a lightly doped epitaxial layer 404 formed on the sacrificial base layer 402, one or more wiring layers 406, 408 in the MOL and BEOL regions, and one or more strap/landing pads 410 formed in the wiring layers. As then shown in FIG. 11, the wafers 300 and 400 are bonded together to form a single integrated wafer, now depicted generally at 500. Again, where oxide is used as the passivation material for the individual wafers, the bonding may be, for example, oxide-to-oxide bonding (e.g., by annealing), oxide/adhesive bonding, or any other suitable technique known in the art that results in a strong bond between electrically insulating layers. Thus bonded, integrated wafer 500 has a second bonding interface 502 between layers 320 and 520, wherein (like the first bonding interface 302) the second bonding interface 502 is comprised entirely of insulating materials, and no conducting materials such as vias.

Figure 12:
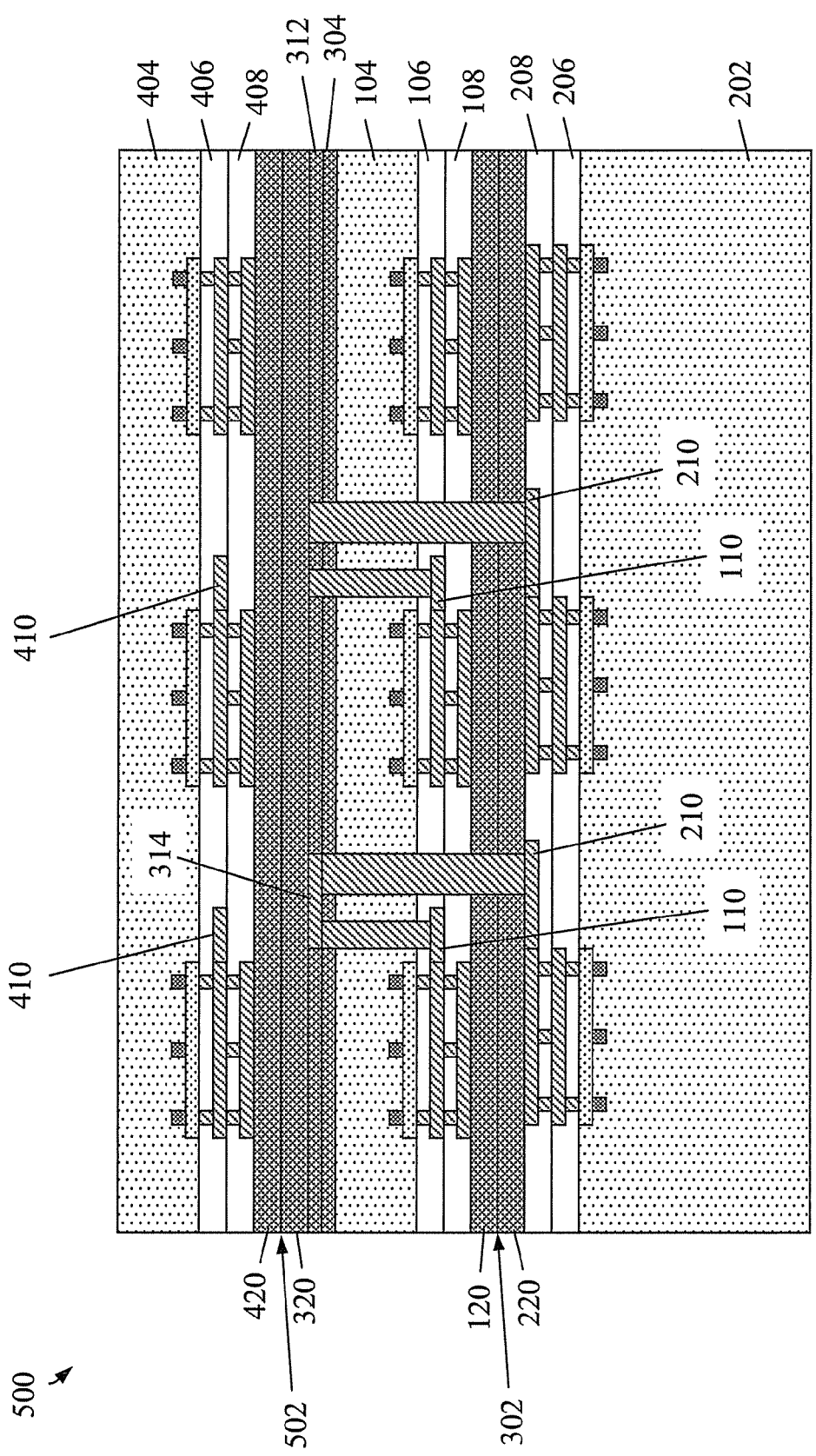
Figure 13:
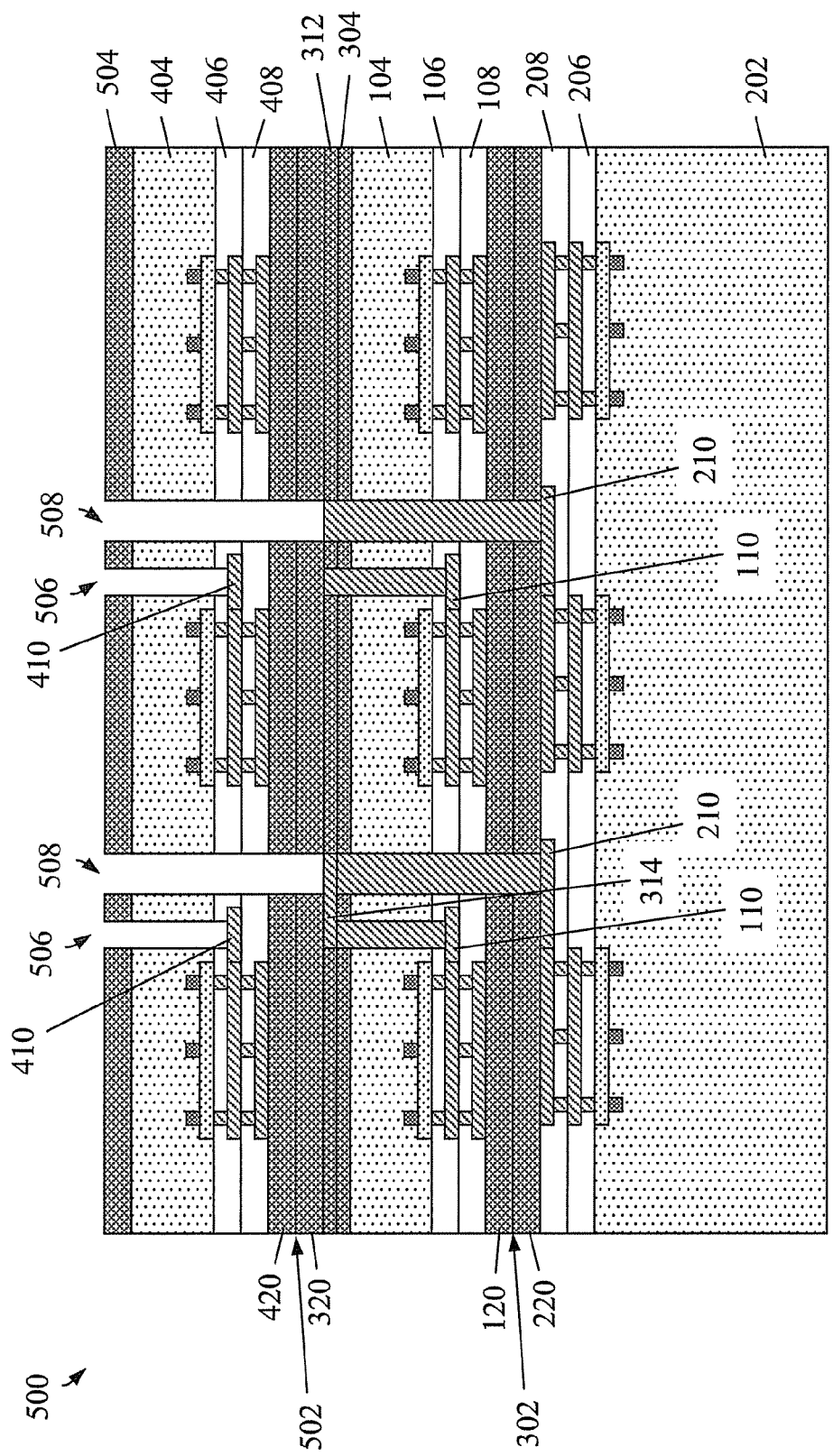

The next steps in the processing sequence are similar to that shown in FIGS. 5-8. For example, in FIG. 12, the thick sacrificial base layer 402 used in forming the second memory wafer 400 is removed by any suitable means in the semiconductor arts such as grinding, CMP, etching, etc. Upon removal of the sacrificial base layer, the epitaxial layer 404 of the second memory portion of the integrated wafer 500 is now exposed for further processing. FIG. 13 then illustrates the formation of another set of TSVs, including forming a passivation layer 504 (e.g., an oxide) on the epitaxial layer 404. Once again, a shallow set of TSVs 506 is formed through the passivation layer 504, the epitaxial layer 404, and one or more of the wiring layers 406, 408 corresponding to the particular locations of the landing pads 410 of the second memory portion of the wafer 500. In addition, a deep set of TSVs 508 is formed through the entirety of the second memory portion of the wafer 500, as well as the passivation layers 420 and 320. In the exemplary embodiment depicted, one of the deep TSVs 508 lands on the strap 314 that connects circuitry between the processor and first memory portions of the wafer 500. Another of the deep TSVs 508 is shown to connect to an earlier formed TSV, thereby extending the total depth of the TSV 508 from the top of the device down to the landing strap 210 in the processor portion.

Figure 14:
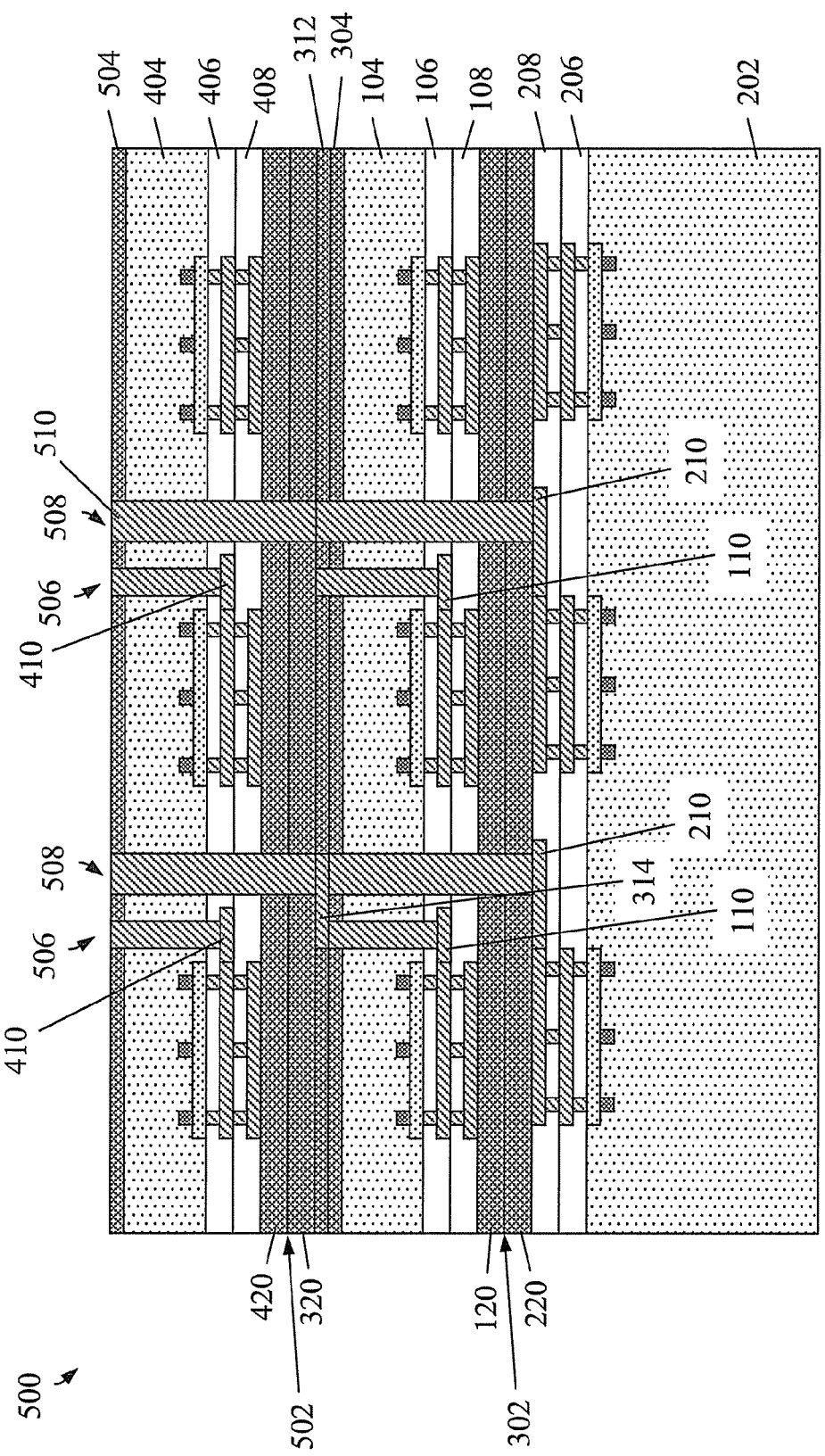
Figure 15:
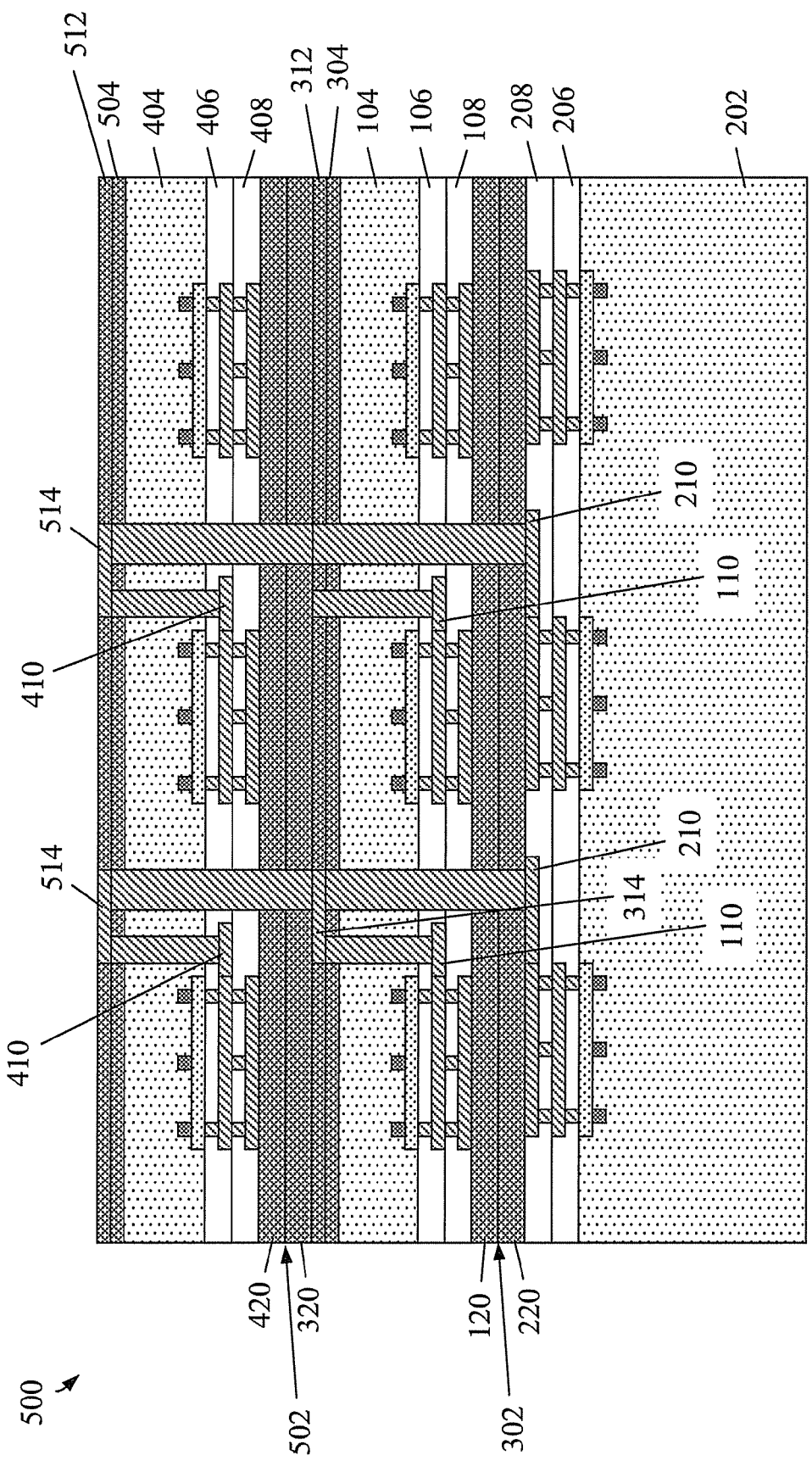

After the etch of both sets of the TSVs 506, 508, an oxide liner is formed on sidewalls thereof in order to prevent subsequent diffusion of the conductive via fill materials. The deposition of the thin oxide liner is then followed up by an anisotropic etch to remove the liner from the horizontal surfaces. Then, standard processing may be carried out to form a via liner layer (e.g., tantalum, tantalum nitride, etc.), metal seed layer, and metal fill 510 (e.g., copper), after which the excess material is planarized such as by CMP, as shown in FIG. 14. In FIG. 15, connection straps between shallow and deep TSVs are formed. In particular, another passivation (e.g., oxide) layer 512 is formed, followed by patterning etching, liner layer, seed layer, metal plating and CMP to form connection straps 514 between the shallow/deep TSV pair. Again, although the illustrated embodiment is an example of single damascene processing, it will be understood that dual damascene processing can also be used to simultaneously define and fill the via and strap structures.

Figure 16:
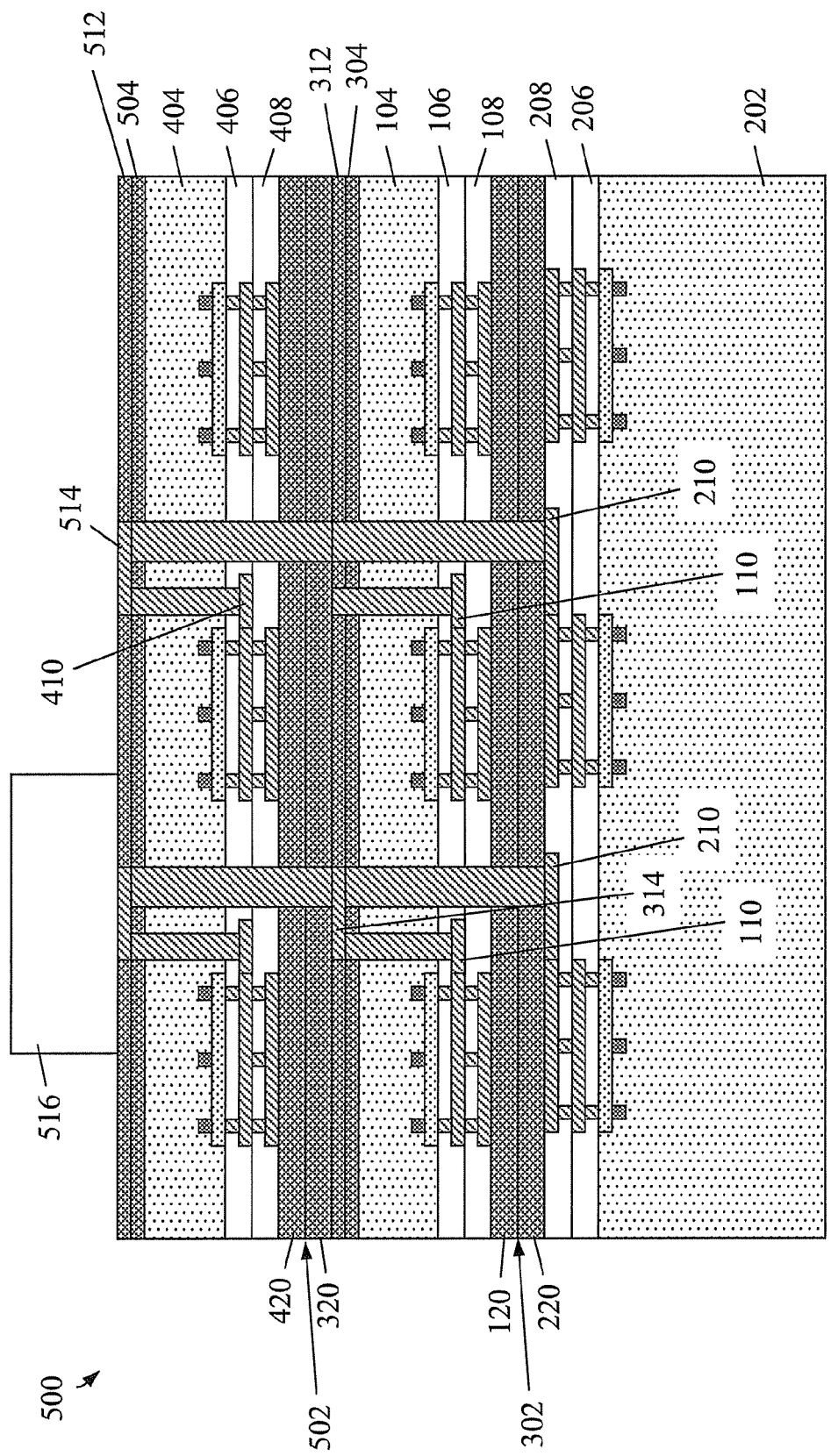

Finally, FIG. 16 depicts a capture pad 516 (e.g., C4) formed atop the wafer 500 for providing external electrical contact for the 3D integrated wafer 500. The capture pad 516 may be formed with or without another passivation layer (not shown). Again, prior to formation of any external capture pads, additional wafer layer may also be stacked and bonded, in the manner described above, prior to a "via last" definition that electrically interconnects the bonded wafers. In so doing, all bonding processes are, in essence, insulator-to-insulator in that no alignment/bonding of conductive structures need take place for the integration. It is noted that although the deep TSVs ultimately pass through a wafer bonding interface, the vias themselves do not comprise a part of that interface since the metal fill takes place post-bonding.

It should be understood that the exemplary process flow described herein may have many variations including, but not limited to, the use of straight, "via only" wafers, wafers with only wiring redistribution and wafer connection TSVs, and wafers having specific features such as capacitors, voltage regulator modules (VRMs), etc. In addition, the various wafers (e.g., processors, wafers) may also include buried oxide (BOX) layers therein for SOI applications.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of implementing three-dimensional (3D) integration of multiple integrated circuit (IC) devices, the method comprising:

forming a first insulating layer directly on a first upper surface of a first wiring layer formed in a first IC device, the first insulating layer formed separately from the first wiring layer absent of electrically conductive materials embedded therein, the first wiring layer being a different layer from the first insulating layer and having a first upper layer surface that is flush with an upper surface of a first conductive element formed in the first wiring layer;

forming a second insulating layer directly on a second upper surface of a second wiring layer formed in a second IC device, the second insulating layer formed separately from the second wiring layer and absent of electrically conductive materials embedded therein, the second wiring layer being a different layer from the second insulating layer and having a second upper layer surface that is flush with an upper surface of a second conductive element;

forming a 3D, bonded IC device by aligning the first insulating layer of the first IC device to the second insulating layer of the second IC device and bonding the first insulating layer of the first IC device to the second insulating layer of the second IC device using only an insulator-to-insulator bonding process so as to define a first bonding interface therebetween that consists only of the first and second insulating layers, wherein the first bonding interface is absent of electrically conductive materials;

subsequent to the bonding, defining a first set of vias within the 3D bonded IC device, the first set of vias landing only on conductive pads located within the first IC device, and defining a second set of vias within the 3D bonded IC device, the second set of vias landing only on conductive pads located within the second device, such that the second set of vias passes through the first bonding interface; and filling the first and second sets of vias with a conductive material, and electrically connecting at least one via of the first set of vias to at least one via of the second set of vias, thereby establishing electrical communication between the first and second ICs of the 3D bonded IC device.

2. The method of claim 1, further comprising:

forming a third insulating layer over the 3D bonded IC device;

forming a fourth insulating layer over a third IC device;

attaching the third IC device to the 3D bonded IC device by aligning and bonding the fourth insulating layer of the third IC device to the third insulating layer of the 3D bonded IC device so as to define a second bonding interface therebetween, wherein the second bonding interface is absent of electrically conductive materials;

defining a third set of vias within the 3D bonded IC device, the third set of vias landing on conductive pads located within the third IC device, and defining a fourth set of vias within the 3D bonded IC device, the fourth set of vias landing on one or more of the second set of vias within the 3D bonded IC device and electrical connections between the first and second sets of vias within the 3D bonded IC device, such that the fourth set of vias passes through the second bonding interface; and filling the third and fourth sets of vias with a conductive material, and electrically connecting at least one via of the third set of vias to at least one via of the fourth set of vias, thereby establishing electrical communication between the first, second and third ICs of the 3D bonded IC device.

3. The method of claim 2, wherein the first IC device comprises a memory device, the second IC device comprises a processor device, and the third IC device comprises another memory device.

4. The method of claim 1, wherein the first IC device comprises an epitaxially grown semiconductor layer formed on a sacrificial base layer, and wherein the sacrificial base layer is removed subsequent to bonding the first and second IC devices, and prior to formation of the first and second sets of vias.

5. The method of claim 4, wherein the sacrificial base layer of the first IC device has a substantially higher dopant concentration with respect to the epitaxially grown semiconductor layer so as to create an etch selectivity therebetween.

6. The method of claim 1, wherein the first and second insulating layers comprise oxide layers, and the bonding comprises one or more of oxide-to-oxide bonding.

7. The method of claim 1, further comprising forming an oxide liner over the first and second sets of vias after etching thereof and removing portions of the oxide liner on horizontal surfaces of the 3D bonded IC device prior to filling the first and second sets of vias with the conductive material.

8. The method of claim 1, wherein vias of the second set of vias are deeper than vias of the first set of vias, and wherein the second conductive element is formed completely beneath the second insulation layer and the second set of vias extend completely through the first and second insulation layers so as to contact the second conductive element.

9. The method of claim 8, wherein vias of the second set of vias have a larger diameter than vias of the first set of vias.

10. The method of claim 1, wherein the first IC device comprises a memory device and the second IC device comprises a processor device.

11. A method of implementing three-dimensional (3D) integration of multiple integrated circuit (IC) devices, the method comprising:

forming a first IC device having a semiconductor substrate, front-end-of-line (FEOL) structures, middle-of-line (MOL) structures, and back-end-of-line (BEOL) structures, with a first insulating layer disposed directly on a first upper surface of a first wiring layer formed in over the BEOL structures of the first IC device, the first insulating layer absent of electrically conductive materials embedded therein, the first wiring layer being a separate layer from the first insulating layer and having a first upper layer surface that is flush with an upper surface of a first conductive element formed in the first wiring layer;

forming a second IC device having a semiconductor substrate, FEOL structures, MOL structures, and BEOL structures, with a second insulating layer disposed directly on a second upper surface of a first wiring layer formed over the BEOL structures of the second IC device, the second insulating layer absent of electrically conductive materials embedded therein, the second wiring layer being a separate layer from the second insulating layer and having a second upper layer surface that is flush with an upper surface of a second conductive element formed in the first wiring layer;

forming a 3D, bonded IC device by aligning the first insulating layer of the first IC device to the second insulating layer of the second IC device and bonding the first insulating layer of the first IC device to the second insulating layer of the second IC device using only an insulator-to-insulator bonding process so as to define a first bonding interface therebetween that consists only of the first and second insulating layers, wherein the first bonding interface is absent of electrically conductive materials;

subsequent to the bonding, defining a first set of vias within the 3D bonded IC device, the first set of vias landing only on conductive pads located within the first IC device, and defining a second set of vias within the 3D bonded IC device, the second set of vias landing only on conductive pads located within the second device, such that the second set of vias passes through the first bonding interface; and filling the first and second sets of vias with a conductive material, and electrically connecting at least one via of the first set of vias to at least one via of the second set of vias, thereby establishing electrical communication between the first and second ICs of the 3D bonded IC device.

12. The method of claim 11, further comprising:
forming a third insulating layer over the 3D bonded IC device;
forming a third IC device having a semiconductor substrate, FEOL structures, MOL structures, and BEOL structures, with a fourth insulating layer over the BEOL structures of the third IC device;
attaching the third IC device to the 3D bonded IC device by aligning and bonding the fourth insulating layer of the third IC device to the third insulating layer of the 3D bonded IC device so as to define a second bonding interface therebetween, wherein the second bonding interface is absent of electrically conductive materials;
defining a third set of vias within the 3D bonded IC device, the third set of vias landing on conductive pads located within the third IC device, and defining a fourth set of vias within the 3D bonded IC device, the fourth set of vias landing on one or more of the second set of vias within the 3D bonded IC device and electrical connections between the first and second sets of vias within the 3D bonded IC device, such that the fourth set of vias passes through the second bonding interface; and
filling the third and fourth sets of vias with a conductive material, and electrically connecting at least one via of the third set of vias to at least one via of the fourth set of vias, thereby establishing electrical communication between the first, second and third ICs of the 3D bonded IC device.

13. The method of claim 12, wherein the first IC device comprises a memory device, the second IC device comprises a processor device, and the third IC device comprises another memory device.

14. The method of claim 11, wherein the forming the first IC device comprises epitaxially growing the semiconductor layer thereof on a sacrificial base layer, and wherein removing the sacrificial base layer subsequent to bonding the first and second IC devices, and prior to formation of the first and second sets of vias.

15. The method of claim 14, wherein the sacrificial base layer of the first IC device has a substantially higher dopant concentration with respect to the epitaxially grown semiconductor layer so as to create an etch selectivity therebetween.

16. The method of claim 11, wherein the first and second insulating layers comprise oxide layers, and the bonding comprises one or more of oxide-to-oxide bonding.

17. The method of claim 11, further comprising forming an oxide liner over the first and second sets of vias after etching thereof and removing portions of the oxide liner on horizontal surfaces of the 3D bonded IC device prior to filling the first and second sets of vias with the conductive material.

18. The method of claim 11, wherein vias of the second set of vias are deeper than vias of the first set of vias, and wherein the second conductive element is formed completely beneath the second insulation layer and the second set of vias extend completely through the first and second insulation layers so as to contact the second conductive element.

19. The method of claim 18, wherein vias of the second set of vias have a larger diameter than vias of the first set of vias.

20. The method of claim 11, wherein the first IC device comprises a memory device and the second IC device comprises a processor device.

21. A three-dimensional (3D) integrated circuit (IC) device, comprising:
a first IC device bonded to a second IC device at a first bonding interface therebetween, thereby defining a 3D, bonded IC device, the first bonding interface defined between a first insulating layer of the first IC device and second insulating layer of the second IC device,
the first insulating layer directly on a first upper surface of a first wiring layer in the first IC device, the first wiring layer being a separate layer from the first insulating layer and having a first upper layer surface that is flush with an upper surface of a first conductive element formed in the first wiring layer,
the second insulating layer directly on a second upper surface of a second wiring layer in the second IC device, the second wiring layer being a separate layer from the second insulating layer and having a second upper layer surface that is flush with an upper surface of a second conductive element formed in the second wiring layer,
wherein the first insulating layer, the second insulating layer, and the first bonding interface are absent of electrically conductive materials, and wherein the first bonding interface consists only of the first and second insulating layers;
a first set of vias defined within the 3D bonded IC device, the first set of vias landing only on conductive pads located within the first IC device, and a second set of vias defined within the 3D bonded IC device, the second set of vias landing only on conductive pads located within the second device, such that the second set of vias passes through the first bonding interface; and
the first and second sets of vias filled with a conductive material, and electrically connecting at least one via of the first set of vias to at least one via of the second set of vias, thereby establishing electrical communication between the first and second ICs of the 3D bonded IC device.

22. The device of claim 21, further comprising:
a third IC device attached to the 3D bonded IC device at a second bonding interface therebetween, the second bonding interface defined between a third insulating layer formed over the 3D bonded IC device and a fourth insulating layer formed of the third IC device;
a third set of vias defined within the 3D bonded IC device, the third set of vias landing on conductive pads located within the third IC device, and a fourth set of vias defined within the 3D bonded IC device, the fourth set of vias landing on one or more of the second set of vias within the 3D bonded IC device;
electrical connections between the first and second sets of vias within the 3D bonded IC device, such that the fourth set of vias passes through the second bonding interface; and
the third and fourth sets of vias filled with a conductive material, and electrically connecting at least one via of the third set of vias to at least one via of the fourth set of vias, thereby establishing electrical communication between the first, second and third ICs of the 3D bonded IC device.

23. The device of claim 22, wherein the first IC device comprises a memory device, the second IC device comprises a processor device, and the third IC device comprises another memory device.

24. The device of claim 21, wherein the first and second insulating layers comprise oxide layers.

25. The device of claim 21, wherein vias of the second set of vias are deeper than vias of the first set of vias, and wherein the second conductive element is formed completely beneath the second insulation layer and the second set of vias extend completely through the first and second insulation layers so as to contact the second conductive element.

26. The device of claim 25, wherein vias of the second set of vias have a larger diameter than vias of the first set of vias.

27. The device of claim 21, wherein the first IC device comprises a memory device and the second IC device comprises a processor device.

\* \* \* \* \*